(12) United States Patent
Zhang et al.

(10) Patent No.: US 12,422,321 B2
(45) Date of Patent: Sep. 23, 2025

(54) PRESSURE SENSOR WITH MANUFACTURING EFFICIENCY AND STRUCTURE STABILITY

(71) Applicant: BEIJING AURASKY ELECTRONICS CO., LTD., Beijing (CN)

(72) Inventors: Feng Zhang, Beijing (CN); Changhua Mou, Beijing (CN); Di Zhao, Beijing (CN); Lei Hu, Beijing (CN); Chen Sui, Beijing (CN); Qi Wang, Beijing (CN); Xiao Li, Beijing (CN); Zhaoxing Li, Beijing (CN); Qingli Yang, Beijing (CN); Zhen Peng, Beijing (CN); Bowen Deng, Beijing (CN)

(73) Assignee: BEIJING AURASKY ELECTRONICS CO., LTD., Beijing (CN)

( * ) Notice: Subject to any disclaimer, the term of this patent is extended or adjusted under 35 U.S.C. 154(b) by 0 days.

(21) Appl. No.: 18/863,142

(22) PCT Filed: May 5, 2023

(86) PCT No.: PCT/CN2023/092175
§ 371 (c)(1),
(2) Date: Nov. 5, 2024

(87) PCT Pub. No.: WO2023/216972
PCT Pub. Date: Nov. 16, 2023

(65) Prior Publication Data
US 2025/0258054 A1    Aug. 14, 2025

(30) Foreign Application Priority Data
May 11, 2022  (CN) .......................... 202210510701.4

(51) Int. Cl.
*G01L 9/00*   (2006.01)
*G01L 19/00*  (2006.01)
*G01L 19/14*  (2006.01)

(52) U.S. Cl.
CPC ........ *G01L 9/0072* (2013.01); *G01L 19/0038* (2013.01); *G01L 19/142* (2013.01)

(58) Field of Classification Search
None
See application file for complete search history.

(56) References Cited

U.S. PATENT DOCUMENTS

| 8,672,240 B2 * | 3/2014 | Masarwa | B05B 1/202 |
| | | | 138/124 |
| 9,859,485 B1 * | 1/2018 | Kim | H10N 10/17 |

(Continued)

FOREIGN PATENT DOCUMENTS

| CN | 1334451 | 2/2002 |
| CN | 1283267 | 11/2006 |

(Continued)

OTHER PUBLICATIONS

Chinese Office Action dated Jul. 4, 2023.

(Continued)

*Primary Examiner* — John E Breene
*Assistant Examiner* — Nigel H Plumb
(74) *Attorney, Agent, or Firm* — IPSILON USA, LLP

(57) ABSTRACT

Provided is pressure sensor, including top cover assembly, upper seat, movable membrane; each of top and bottom of upper seat is provided with opening, top cover assembly seals opening at top of upper seat, movable membrane seals opening at bottom of upper seat; top cover assembly, upper seat, movable membrane form pressure reference chamber, and pressure sensor detects gas pressure on side of movable membrane away from top cover assembly based on state of (Continued)

movable membrane; at least one gas guide passage is formed at top cover assembly, and is configured to connect pressure reference chamber to outside; top cover assembly includes at least one blocking member configured to seal gas guide passage; and blocking member seals gas guide passage after being heated to temperature higher than preset melting temperature to be at least partially melted and being cooled to solidify. Manufacturing method for pressure sensor is further provided.

19 Claims, 6 Drawing Sheets

(56) References Cited

U.S. PATENT DOCUMENTS

| | | | |
|---|---|---|---|
| 2006/0103131 | A1 | 5/2006 | Masarwa et al. |
| 2018/0013050 | A1* | 1/2018 | Kim ............... H10N 10/17 |
| 2021/0119300 | A1* | 4/2021 | Li ............... H01M 50/375 |

FOREIGN PATENT DOCUMENTS

| | | |
|---|---|---|
| CN | 101267730 | 9/2008 |
| CN | 103017945 | 4/2013 |
| CN | 105443986 | 3/2016 |
| CN | 205987348 | 2/2017 |
| CN | 106644187 | 5/2017 |
| CN | 107611248 | 1/2018 |
| CN | 108132121 | 6/2018 |
| CN | 109774079 | 5/2019 |
| CN | 209981287 | 8/2019 |
| CN | 114088282 | 2/2022 |
| CN | 114754916 | 7/2022 |
| DE | 102018200791 | 7/2019 |
| DE | 102018108744 | 10/2019 |
| JP | S5793225 | 6/1982 |
| JP | H1154785 | 6/1999 |
| JP | 2014020785 | 2/2014 |
| JP | 2014039936 | 3/2014 |
| TW | 524968 | 3/2003 |

OTHER PUBLICATIONS

CN Search Report dated Oct. 5, 2023.
CN Notice of Grant Nov. 17, 2023.
CN Notice of Grant Nov. 17, 2023 (ENG).
CN first OA Jul. 4, 2023 (all refs included hereabove).
CN first OA Jul. 4, 2023 (ENG).
CN claims as allowed in OEE (10510701.4).
CN claims as allowed in OEE (10510701.4) (ENG).
International Search Report dated Oct. 5, 2023.
Taiwanese office action dated Jun. 3, 2024.
Japanese Office Action Apr. 15, 2025 (in Japanese—References provided above with at least Eng Abst).

* cited by examiner

PRESSURE SENSOR WITH MANUFACTURING EFFICIENCY AND STRUCTURE STABILITY

RELATED APPLICATION

This application is a National Phase of PCT/CN2023/092175 filed on May 5, 2022, which claims the benefit of priority from Chinese Patent Application No. 202210510701.4 filed on May 11, 2022, the entirety of which are incorporated by reference.

TECHNICAL FIELD

The present disclosure relates to the field of semiconductor process equipment, and in particular, to a pressure sensor and a manufacturing method for a pressure sensor.

BACKGROUND

In the semiconductor field, high-precision monitoring of pressure of a process gas is generally required when chips are produced by etching or with other methods, so as to accurately control the pressure and flow of the gas, thereby producing high-quality products.

However, existing pressure sensors are complicated in manufacturing process and low in manufacturing efficiency, and are usually faced with the problem of decline in precision in use. Therefore, how to provide a pressure sensor structure which has high stability and can be easily manufactured is an urgent technical problem to be solved in the prior art.

SUMMARY

The present disclosure aims to provide a pressure sensor and a manufacturing method for a pressure sensor, and the pressure sensor has high manufacturing efficiency, stable structure, and high pressure detection precision.

In order to achieve the above objective, in one aspect of the present disclosure, there is provided a pressure sensor, including a top cover assembly, an upper seat, and a movable membrane, each of a top and a bottom of the upper seat is provided with an opening, the top cover assembly seals the opening at the top of the upper seat, the movable membrane seals the opening at the bottom of the upper seat, the top cover assembly, the upper seat, and the movable membrane form a pressure reference chamber, the pressure sensor is configured to detect a gas pressure on a side of the movable membrane away from the top cover assembly based on a state of the movable membrane, at least one gas guide passage is formed at the top cover assembly, and is configured to connect the pressure reference chamber to the outside, the top cover assembly includes at least one blocking member configured to seal the gas guide passage, wherein, the blocking member seals the gas guide passage after being heated to a temperature higher than a preset melting temperature to be at least partially melted and being cooled to solidify.

Optionally, the top cover assembly includes a top cover body, which seals the opening at the top of the upper seat, the gas guide passage penetrating through the top cover body along a thickness direction of the top cover body is formed at the top cover body, and the blocking member before melting is disposed on the top cover body and corresponds to the gas guide passage.

Optionally, a size of a cross section of the gas guide passage at any position is smaller than or equal to a size of a cross section of the gas guide passage at a side of the gas guide passage away from the movable membrane.

Optionally, the gas guide passage includes an accommodating hole formed on a top surface of the top cover body, and a through hole penetrating through the top cover body to a bottom surface of the top cover body from a bottom end of the accommodating hole, and a diameter of the accommodating hole is larger than a diameter of the through hole; and the blocking member before melting extends along a direction around an axis of the through hole and is disposed in the accommodating hole.

Optionally, the gas guide passage further includes a variable-diameter hole connected between the accommodating hole and the through hole, and a diameter of the variable-diameter hole gradually increases along a direction departing from the movable membrane.

Optionally, a diameter of the gas guide passage gradually increases along a direction departing from the movable membrane, and the blocking member before melting is disposed in the gas guide passage.

Optionally, the top cover assembly further includes a flow guide member disposed in the gas guide passage; the blocking member before melting is disposed on the flow guide member, and after the blocking member is formed by melting, cooling, and solidifying, the blocking member together with the flow guide member seal the gas guide passage; and the flow guide member is provided with at least one flow guide through hole for connecting the pressure reference chamber to the outside.

Optionally, the top cover assembly includes a top cover body and a gas absorption assembly disposed on the top cover body, the gas absorption assembly includes a pump housing and a getter disposed in the pump housing, the top cover body is provided with a communication passage which connects the pump housing to the pressure reference chamber, and a bottom end of the pump housing is disposed in the communication passage, wherein
  the gas guide passage includes the communication passage and a communication hole penetrating through a sidewall of the bottom end of the pump housing, the pressure reference chamber is communicated with the outside sequentially through the communication passage and the communication hole, the blocking member before melting is disposed on the top cover body and corresponds to the communication hole, and a position of the communication hole is lower than a top surface of the top cover body; and/or
  the gas guide passage includes the communication passage and a gap between the bottom end of the pump housing and the top cover body, the pressure reference chamber is communicated with the outside sequentially through the communication passage and the gap, and the blocking member before melting is disposed outside the pump housing and on the top cover body.

Optionally, a material of the blocking member includes at least one of tin, aluminum, or silver; and a bonding material layer is provided on a surface of the flow guide member and/or an inner wall of the gas guide passage, and a material of the bonding material layer includes at least one of copper or nickel.

In a second aspect of the present disclosure, there is provided a manufacturing method for a pressure sensor for manufacturing the pressure sensor described above, including:

placing the blocking member before melting at a position corresponding to the gas guide passage;

placing at least one pressure sensor that is not blocked in a process chamber;

vacuumizing the process chamber to make a gas pressure in the process chamber lower than a preset pressure;

heating the process chamber to make a temperature in the process chamber not lower than the preset melting temperature; and cooling the process chamber to enable the blocking member, which is formed by melting and solidifying the blocking member before melting, to block the gas guide passage.

Optionally, while vacuumizing the process chamber to make the gas pressure in the process chamber lower than the preset pressure, the manufacturing method further includes heating the process chamber to a first preset temperature, which is lower than the preset melting temperature.

In the pressure sensor provided in embodiments of the present disclosure, the top cover assembly, the upper seat, and the movable membrane form the pressure reference chamber, the top cover assembly is provided with the gas guide passage capable of connecting the interior of the pressure reference chamber to the outside, and the blocking member is used to seal the gas guide passage after being heated to the temperature higher than the preset melting temperature to be at least partially melted and being cooled to solidify. In this way, only by vacuumizing the pressure reference chamber before the blocking member is mounted and heating and cooling the pressure sensor after the blocking member is mounted, the blocking member formed by being melted and cooled to solidify can block the gas guide passage, so that the interior of the pressure reference chamber can be isolated from the external environment, thereby obtaining the pressure sensor capable of being used for pressure detection. During a manufacturing process of the pressure sensor provided in the present disclosure, there is no need to assemble structures such as a vacuum pump and a copper tube, so that manufacturing efficiency of the pressure sensor is increased. Moreover, compared with an exposed cut-off portion of the copper tube, the structure of blocking the gas guide passage with the blocking member, which can be at least partially melted and cooled to solidify to seal the gas guide passage, in the present disclosure is more stable, so that stability of an overall structure of the pressure sensor is improved, thereby effectively avoiding gas leakage of the pressure reference chamber, and ensuring pressure detection precision of the pressure sensor.

In addition, a plurality of pressure sensors provided in the present disclosure can be simultaneously subjected to a sealing process on the pressure reference chambers, thereby increasing the manufacturing efficiency of the pressure sensor.

BRIEF DESCRIPTION OF DRAWINGS

The accompany drawings are intended to provide a further understanding of the present disclosure and constitute a part of the specification. Together with the following specific embodiments, the drawings are used to explain the present disclosure, but do not constitute any limitation to the present disclosure. In the drawings.

Figure 1:
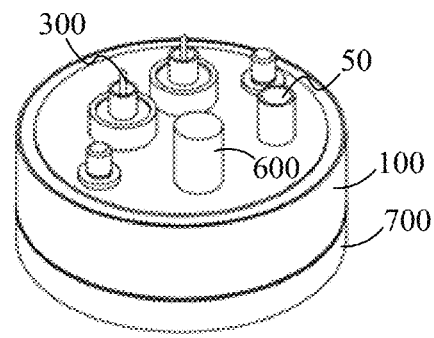
FIG. 1 is a schematic structural diagram of an existing pressure sensor.

| Reference numerals: | |
|---|---|
| 100: pressure reference chamber | 110: top cover body |
| 120: upper seat | 200: movable membrane |
| 300: pin | 400: mounting member |
| 410: inner electrode | 510: gas guide passage |
| 511: accommodating hole | 512: through hole |
| 513: variable-diameter hole | 520: melting member |
| 521: blocking member | 530: flow guide member |
| 600: gas absorption assembly | 610: pump housing |
| 611: communication hole | 620: getter |
| 630: filter screen | 700: lower seat |

DETAIL DESCRIPTION OF EMBODIMENTS

The specific embodiments of the present disclosure are described in detail below with reference to the drawings. It should be understood that the specific embodiments described herein are only used to describe and explain the present disclosure, rather than limiting the present disclosure.

Figure 2:
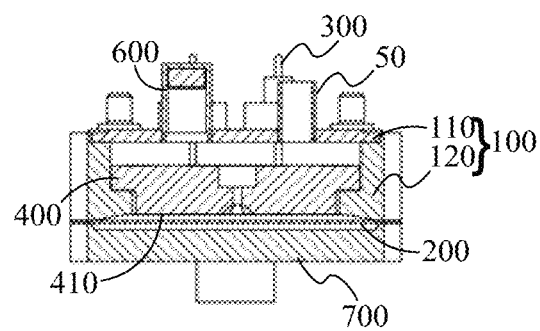
FIG. 2 is a sectional view of the pressure sensor of FIG. 1.

As shown in FIG. 1 and FIG. 2 which are schematic structural diagrams of an existing pressure sensor, the pressure sensor includes a pressure reference chamber 100, a pin 300, an inner electrode 410, and a copper tube 50, a movable membrane 200 is sealed at a bottom opening of the pressure reference chamber 100, a top of the pressure reference chamber 100 is sealed by a top cover body 110, the inner electrode 410 is fixedly disposed in the pressure reference chamber 100 and is spaced apart and parallel to the movable membrane 200, one end of the pin 300 is connected to the inner electrode 410, the other end of the pin 300 penetrates through and extends outside the pressure reference chamber 100, the copper tube 50 is fixedly connected to the top cover body 110 of the pressure reference chamber 100, one end of the copper tube 50 is communicated with an interior of the pressure reference chamber 100, and the other end of the copper tube 50 is communicated with the outside.

Figure 3:
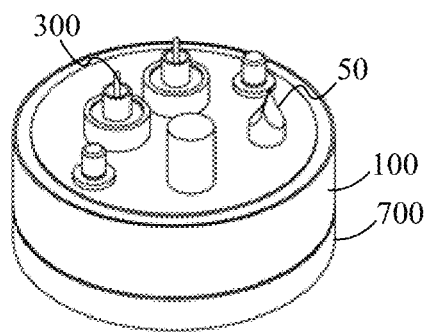
FIG. 3 is a schematic diagram illustrating a state after a copper tube of the pressure sensor of FIG. 1 is cut off.

Before the pressure sensor is put into use, a gas in the pressure reference chamber 100 needs to be drawn out through the copper tube 50, so as to generate a low-pressure environment inside the pressure reference chamber 100; and then the copper tube 50 is cut off, as shown in FIG. 3, at this time, the pressure reference chamber 100 is completely isolated from the external environment, so that the low pressure inside the pressure reference chamber 100 may be maintained, thereby obtaining the useable pressure sensor.

When the pressure sensor is placed in an environment to be measured, the movable membrane 200 deforms under the action of a pressure difference between the internal pressure of the pressure reference chamber 100 and an external pressure, so that a distance between the movable membrane 200 and the inner electrode 410 is changed. The higher the external pressure is, the smaller the distance between the movable membrane 200 and the inner electrode 410 is; and the lower the external pressure is, the larger the distance between the movable membrane 200 and the inner electrode 410 is, so that a capacitance value of a capacitor structure formed by the movable membrane 200 and the inner electrode 410 is correspondingly changed. At this time, a detection circuit is electrically connected to the inner electrode 410 through the pin 300, so that a gas pressure of the environment where the pressure sensor is located may be determined in response to the change of the capacitance between the movable membrane 200 and the inner electrode 410, thereby performing a pressure detection function.

However, it is found through research that a cut-off portion of the copper tube 50 of the pressure sensor which is put into use is exposed to the outside and has a thin tube wall, such that the cut-off portion of the copper tube 50 becomes the risk of gas leakage. The copper tube 50 only functions in a vacuumizing step, which causes material waste. Moreover, a manufacturing process of the copper tube 50 is complicated. For example, a through hole needs to be made in advance at the top cover body 110, the copper tube 50 is welded on the top cover body 110, the pressure sensor is heated at a high temperature to raise a temperature of the pressure sensor to hundreds of degrees Celsius, and a top end of the copper tube 50 is connected to a vacuum pump, the pressure reference chamber 100 is vacuumized with the vacuum pump to quickly reduce the pressure of the pressure reference chamber 100 to a relative low pressure value, and then the copper tube 50 is cut off and sealed. In the prior art, the above procedures of connecting to the vacuum pump, vacuumizing, cutting off, and sealing are generally required to be sequentially performed on each pressure sensor, so that the pressure sensor products have to be processed one by one, which consumes a large amount of production time. In addition, if the cutting-off and sealing procedures of the copper tube 50 fail, it is difficult to perform a secondary repair on the pressure sensor product, resulting in an increase in manufacturing cost of the pressure sensor.

Figure 4:
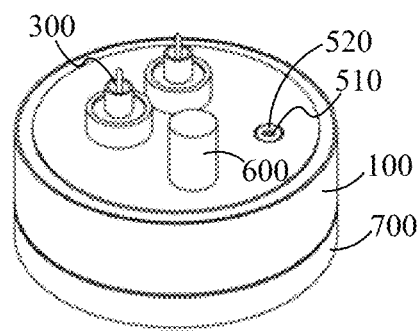
FIG. 4 is a schematic structural diagram of a pressure sensor according to an embodiment of the present disclosure.
Figure 5:
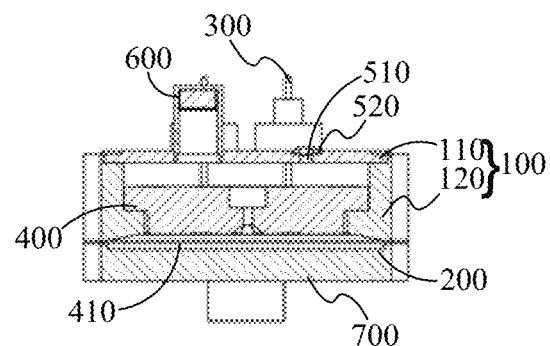
FIG. 5 is a sectional view of the pressure sensor of FIG. 4.

In order to solve the above technical problem, in one aspect of the present disclosure, there is provided a pressure sensor. As shown in FIG. 4 and FIG. 5, the pressure sensor includes a top cover assembly 130 (including a top cover body 110 and some structures disposed thereon), an upper seat 120, and a movable membrane 200, each of a top and a bottom of the upper seat 120 is provided with an opening, the top cover assembly 130 seals the opening at the top of the upper seat 120, the movable membrane 200 seals the opening at the bottom of the upper seat 120, and the top cover assembly 130, the upper seat 120, and the movable membrane 200 form a pressure reference chamber 100. The pressure sensor is configured to detect a gas pressure on a side of the movable membrane 200 away from the top cover assembly 130 based on a state of the movable membrane 200. Specifically, the higher the pressure outside the pressure reference chamber 100 is, the more the movable membrane 200 is recessed; and the lower the pressure outside the pressure reference chamber 100 is, the less the movable membrane 200 is recessed, so that the pressure sensor may detect the gas pressure on the side of the movable membrane 200 away from the top cover assembly 130 based on the change of the movable membrane 200.

Figure 8:
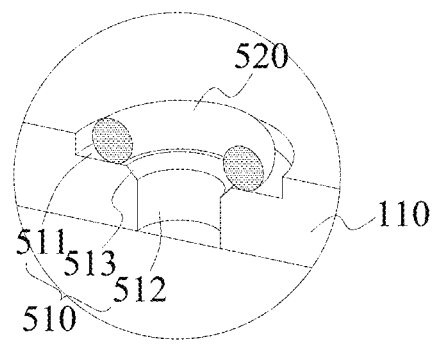
FIG. 8 is a partially enlarged view of an area I of FIG. 7.
Figure 9:
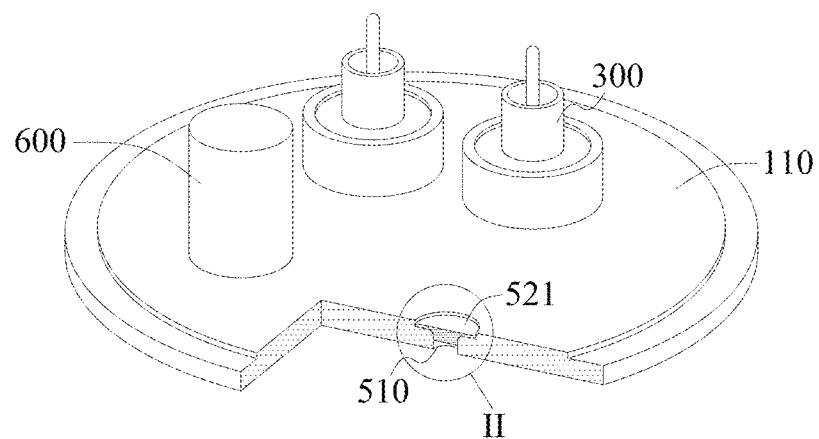
FIG. 9 is a schematic diagram of structures of a top cover part of a pressure sensor according to an embodiment of the present disclosure.

As shown in FIG. 9, at least one gas guide passage 510 is formed at the top cover assembly 130, and is configured to connect the pressure reference chamber 100 to the outside. The top cover assembly 130 includes at least one blocking member 521 configured to seal the gas guide passage 510. As shown in FIG. 7 to FIG. 10, the blocking member 521 seals the gas guide passage 510 after (a melting member 520) being heated to a temperature higher than a preset melting temperature to be at least partially melted and being cooled to solidify.

In the pressure sensor provided in the present disclosure, the top cover assembly 130 is provided with the gas guide passage 510 capable of connecting an interior of the pressure reference chamber 100 to the outside, the melting member 520 is melted (or partially melted) at a high temperature and is then cooled to solidify to form the blocking member 521, and the gas guide passage 510 is sealed with the blocking member 521. Thus, only by vacuumizing the pressure reference chamber 100 before the blocking member 521 is formed and heating and cooling the pressure sensor, the melting member 520 can be melted and cooled to solidify to form the blocking member 521 to seal the gas guide passage 510, so that the interior of the pressure reference chamber 100 can be isolated from the external environment, thereby obtaining the pressure sensor capable of being used for pressure detection. The manufacturing process of the pressure sensor provided in the present disclosure obviates the need to assemble structures such as the vacuum pump and the copper tube, so that manufacturing efficiency of the pressure sensor is increased. Moreover, compared with the exposed cut-off portion of the copper tube, the structure of sealing the gas guide passage 510 with the blocking member 521 formed by melting and cooling to solidify the melting member 520 in the present disclosure is more stable, so that stability of an overall structure of the pressure sensor is improved, thereby effectively avoiding gas leakage of the pressure reference chamber 100, and ensuring pressure detection precision of the pressure sensor.

Figure 6:
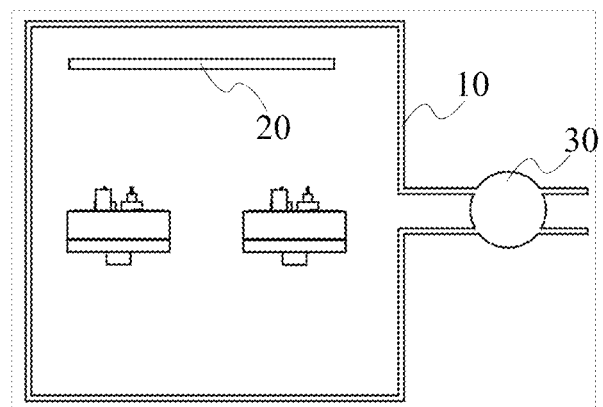
FIG. 6 is a schematic diagram illustrating a principle of a manufacturing method for a pressure sensor according to an embodiment of the present disclosure.

In addition, a plurality of pressure sensors provided in the present disclosure may be simultaneously subjected to a sealing process on the pressure reference chambers 100 (that is, the manufacturing processes of the plurality of pressure sensors may be completed at the same time). Specifically, as shown in FIG. 6, the plurality of pressure sensors (with unmelted melting members 520) provided in the present disclosure may be placed in the same process chamber, the process chamber is vacuumized to make a gas pressure in the process chamber to be lower than a preset pressure, and is heated to raise a temperature inside the process chamber to the preset melting temperature, and then the process chamber is cooled, thereby enabling the melting members 520 in the plurality of pressure sensors to solidify to form the blocking members 521 to block the corresponding gas guide passages 510. In this way, the plurality of pressure sensors provided in the present disclosure can be manufactured in the same process, which greatly increases the manufacturing efficiency of the pressure sensor.

In an alternative embodiment of the present disclosure, the pressure sensor may sense a change of the movable membrane 200 based on an equivalent capacitor structure. Specifically, as shown in FIG. 4 and FIG. 5, the pressure sensor further includes a pin 300 and an inner electrode 410, one end of the pin 300 is connected to the inner electrode 410, and the other end of the pin penetrates through and extends out of the pressure reference chamber 100 and is configured to be connected to a detection circuit (not shown), so that the detection circuit may determine a gas pressure of an environment where the pressure sensor is located in response to a change of capacitance between the movable membrane 200 and the inner electrode 410. That is, with a position of the inner electrode 410 unchanged, as the pressure outside the pressure reference chamber 100 becomes higher, a distance between the movable membrane 200 and the inner electrode 410 is reduced, and the capacitance between the movable membrane 200 and the inner electrode 410 is accordingly increased; conversely, as the pressure outside the pressure reference chamber 100 becomes lower, the distance between the movable membrane 200 and the inner electrode 410 is increased, and the capacitance between the movable membrane 200 and the inner electrode 410 is accordingly reduced. Therefore, the detection circuit may determine the gas pressure on the side of the movable membrane 200 away from the top cover assembly 130 according to a value of the capacitance.

In a preferred embodiment of the present disclosure, as shown in FIG. 4 and FIG. 5, the pressure sensor further includes a lower seat 700, a top of the lower seat 700 is hermetically connected to the bottom of the upper seat 120, a dispersion groove corresponding to a position of the movable membrane 200 is formed on a top surface of the lower seat 700, a connecting pipe is provided at a bottom of the lower seat 700, and a through hole communicated with connecting pipe is formed at a bottom of the dispersion groove. In this way, with no need to be disposed in a gas environment to be measured, the pressure sensor may be remotely connected to the gas environment to be measured through the connecting pipe.

For example, a process chamber which is to be subjected to gas pressure detection may be connected to the connecting pipe of the lower seat 700 through a pipeline, which allows the gas pressure on the side of the movable membrane 200 away from the top cover assembly 130 to be the same as a gas pressure in the to-be-measured process chamber, and then the gas pressure of the to-be-measured gas environment may be remotely detected with the pressure sensor. In this way, difficulty in wiring of the pressure sensor can be reduced, a contact area of the pressure sensor with the to-be-measured gas environment can also be reduced, and service life of the pressure sensor can be prolonged.

In an alternative embodiment of the present disclosure, as shown in FIG. 4 and FIG. 5, the top cover assembly 130 includes the top cover body 110, which seals the opening at the top of the upper seat 120, the gas guide passage 510 penetrating through the top cover body 110 along a thickness direction of the top cover body 110 is formed at the top cover body 110, and the blocking member 521 before melting (i.e., the melting member 520) is disposed on the top cover body 110 and corresponds to the gas guide passage 510.

In an alternative embodiment of the present disclosure, the top cover body 110 is welded to the upper seat 120 to ensure airtightness of the pressure reference chamber 100.

In order to ensure structural strength of the pressure reference chamber 100, in a preferred embodiment of the present disclosure, the top cover body 110, the upper seat 120, and the movable membrane 200 are all made of metal materials.

It should be noted that the number of gas guide passages 510 may be more than one, so as to increase pumping efficiency during the vacuumizing. In order to ensure sealing property of the pressure reference chamber 100, the number of opening structures at the top cover body 110 needs to be as less as possible. For example, as shown in FIG. 4, preferably, only one gas guide passage 510 is provided at the top cover assembly 130.

Figure 18:
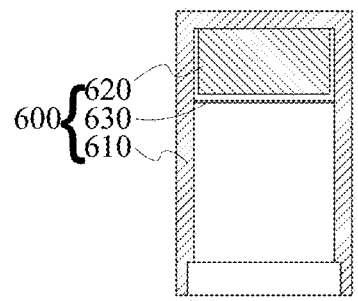
FIG. 18 is a schematic diagram of a partial structure of a pressure sensor according to another embodiment of the present disclosure.

In a preferred embodiment of the present disclosure, as shown in FIG. 4 and FIG. 5, the top cover assembly 130 further includes a gas absorption assembly 600 disposed on the top cover body 110. As shown in FIG. 18, the gas absorption assembly 600 includes a pump housing 610 and a getter 620 disposed in the pump housing 610, a communication passage for connecting the pump housing 610 to the pressure reference chamber 100 is formed at the top cover body 110, and a bottom end of the pump housing 610 is disposed in the communication passage and is communicated with the interior of the pressure reference chamber 100. The getter 620 is capable of continuously absorbing a gas from the pressure reference chamber 100, so as to maintain a low pressure state inside the pressure reference chamber 100. In an alternative embodiment of the present disclosure, as shown in FIG. 18, a horizontal filter screen 630 is provided in the pump housing 610 for preventing the getter from falling into the pressure reference chamber 100.

In an alternative embodiment of the present disclosure, as shown in FIG. 5, a mounting member 400 made of an insulating material is disposed in the pressure reference chamber 100, the mounting member 400 is provided with an outward-protruding annular boss therearound, an inner wall of the upper seat 120 is provided with an inward-protruding annular boss which surrounds the mounting member 400, and the annular boss of the mounting member 400 is mounted on the annular boss of the upper seat 120. The inner electrode 410 is disposed on a bottom surface of the mounting member 400. For example, the inner electrode 410 may be a metal plating layer formed on the bottom surface of the mounting member 400.

Optionally, a conductive through hole penetrating through the mounting member 400 along a height direction is formed in the mounting member 400, metal layers are formed on a top surface of the mounting member 400 and an inner wall of the conductive through hole, the metal layer on the top surface of the mounting member 400 is electrically connected to the inner electrode 410 through the metal layer on the inner wall of the conductive through hole, and the pin 300 is electrically connected to the metal layer on the top surface of the mounting member 400.

In order to ensure a sealing effect of the melted melting member 520 on blocking the gas guide passage 510, in a preferred embodiment of the present disclosure, the gas guide passage 510 is a non-straight hole, and a size of a cross section of the gas guide passage 510 at any position is smaller than or equal to a size of a cross section of the gas guide passage 510 at a side of the gas guide passage 510 away from the movable membrane 200, that is, the size of the cross section of the gas guide passage 510 at any one position of the gas guide passage 510 is smaller than or equal to a size of a cross section of the gas guide passage 510 at another position above the any one position. That is, a diameter of the gas guide passage 510 tends to decrease from top to bottom, so as to ensure that a flow direction of the melted melting member 520 is a downward direction along the gas guide passage 510, and prevent the melted melting member 520 from dispersively flowing on the top cover body 110, thereby ensuring that the melting member 520 can block the gas guide passage 510. Moreover, with the diameter of the gas guide passage 510 reduced at the bottom, when the melted melting member 520 flows downwards, surface tension of a bottom liquid surface can be effectively increased, so that the melted melting member 520 can be effectively prevented from passing through the gas guide passage 510 and falling into the pressure reference chamber 100, thereby ensuring the sealing effect of the melted melting member 520 on blocking the gas guide passage 510.

In a preferred embodiment of the present disclosure, the minimum diameter of the gas guide passage 510 is less than 2 mm, so as to ensure that the surface tension of the bottom liquid surface is large enough when the melting member 520 flows to a position corresponding to the minimum diameter, thereby positioning the liquid melting member 520 in the gas guide passage 510.

In some embodiments of the present disclosure, the melting member 520 may be directly disposed on the top cover body 110 at a position corresponding to the gas guide passage 510.

Figure 11:
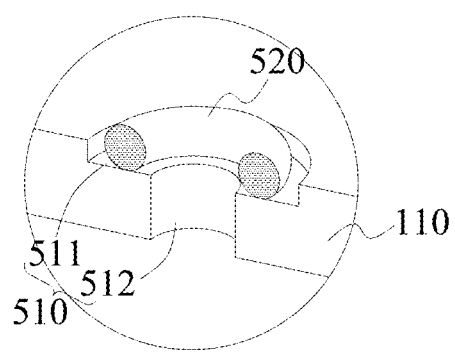
FIG. 11 is a schematic diagram of a partial structure of a pressure sensor according to another embodiment of the present disclosure.
Figure 12:
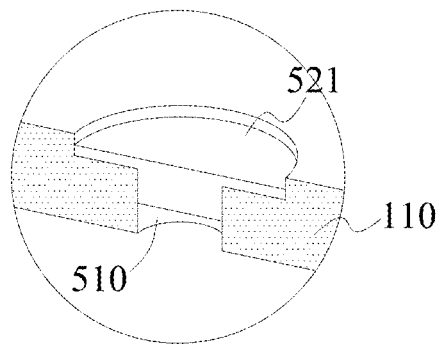
FIG. 12 is a schematic diagram illustrating a principle of blocking a gas guide passage by a melting member of FIG. 11 after the melting member is melted and solidified.

In order to ensure stability of a position of the melting member 520, in a preferred embodiment of the present disclosure, as shown in FIG. 11 and FIG. 12, the gas guide passage 510 includes an accommodating hole 511 formed on a top surface of the top cover body 110, and a through hole 512 penetrating through the top cover body 110 to a bottom surface of the top cover body 110 from a bottom end of the accommodating hole 511, and a diameter of the accommodating hole 511 is larger than that of the through hole 512. The blocking member 521 before melting (i.e., the melting member 520) extends along a direction around an axis of the through hole 512 and is disposed in the accommodating hole 511. For example, the accommodating hole 511 and the through hole 512 are sequentially connected to each other from the top surface of the top cover body 110 to the bottom surface of the top cover body 110, that is, one end of the accommodating hole 511 is located at the top surface of the top cover body 110, the other end of the accommodating hole 511 is communicated with one end of the through hole 512, and the other end of the through hole 512 is located at the bottom surface of the top cover body 110.

In the embodiments of the present disclosure, the melting member 520 is disposed in the accommodating hole 511 with the maximum diameter, so that a shift in the position of the melting member 520 can be avoided, thereby improving the stability of the position of the melting member 520. Moreover, the melting member 520 is bent and extends along the direction around the axis of the through hole 512, so that an orthographic projection of the melting member 520 on a radial section of the through hole 512 can avoid the through hole 512 with the minimum diameter, which can prevent the gas when being blown out through the through hole 512 in the vacuumizing step from changing the position of the melting member 520 and thus avoid an influence on smoothness of the melting member 520 flowing into the through hole 512.

In some embodiments of the present disclosure, the melting member 520 may be a sheet-like member, or may be a curved strip-like member. For example, the melting member 520 may be a curved C-shaped member around the axis of the through hole 512. In order to improve circumferential uniformity of a force applied between the melting member 520 and the gas guide passage 510 to ensure the stability of the position of the melting member 520, in a preferred embodiment of the present disclosure, a shape of the blocking member 521 before melting (i.e., the melting member 520) is a ring shape.

Figure 7:
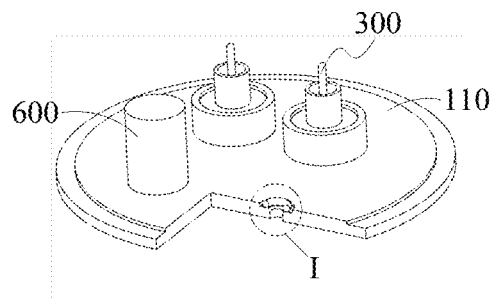
FIG. 7 is a schematic diagram of structures of a top cover part of a pressure sensor according to an embodiment of the present disclosure.
Figure 10:
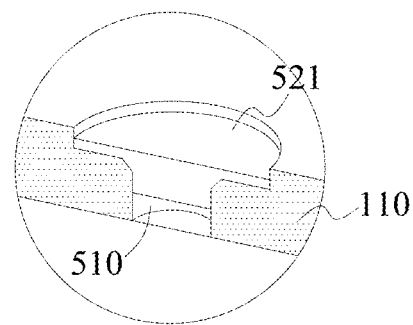
FIG. 10 is a partially enlarged view of an area II of FIG. 9.

In order to improve the smoothness of the melted melting member 520 flowing downwards along the gas guide passage 510, in a preferred embodiment of the present disclosure, as shown in FIG. 7, FIG. 8, and FIG. 10, the gas guide passage 510 further includes a variable-diameter hole 513 connected between the accommodating hole 511 and the through hole 512. A diameter of the variable-diameter hole 513 gradually increases along a direction departing from the movable membrane 200, so as to make transition between the accommodating hole 511 and the through hole 512 smoother and improve the smoothness of the melted melting member 520 flowing along the accommodating hole 511, the variable-diameter hole 513, and the through hole 512, thereby ensuring the sealing effect of the melted melting member 520 on blocking the gas guide passage 510.

In another preferred embodiment of the present disclosure, as shown in FIG. 13 to FIG. 16, the diameter of the gas guide passage 510 gradually increases along a direction departing from the movable membrane 200, and the blocking member 521 before melting (i.e., the melting member 520) is disposed in the gas guide passage 510, that is, the diameter of the gas guide passage 510 is gradually changed along a height direction, so as to reduce structures such as edges or steps on an inner wall of the gas guide passage 510, thereby improving the smoothness of the melted melting member 520 flowing downwards along the gas guide passage 51, and ensuring the sealing effect of the melted melting member 520 on blocking the gas guide passage 510.

Figure 13:
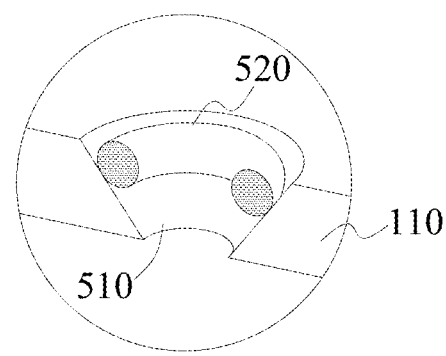
FIG. 13 is a schematic diagram of a partial structure of a pressure sensor according to another embodiment of the present disclosure.
Figure 14:
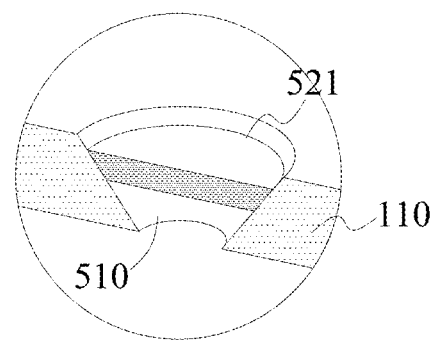
FIG. 14 is a schematic diagram illustrating a principle of blocking a gas guide passage by a melting member of FIG. 13 after the melting member is melted and solidified.

In some embodiments of the present disclosure, as shown in FIG. 13 and FIG. 14, a rate of a change of the diameter of the gas guide passage 510 with a height (the amount of the change of the diameter per fixed height change) is unchanged, that is, the gas guide passage 510 is formed into a tapered hole.

Figure 15:
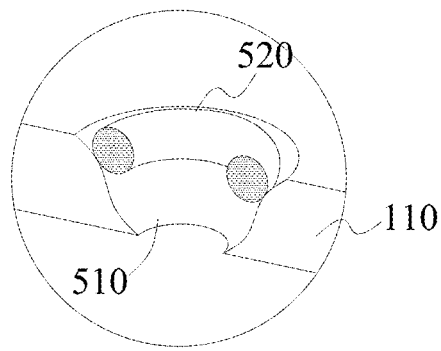
FIG. 15 is a schematic diagram of a partial structure of a pressure sensor according to another embodiment of the present disclosure.
Figure 16:
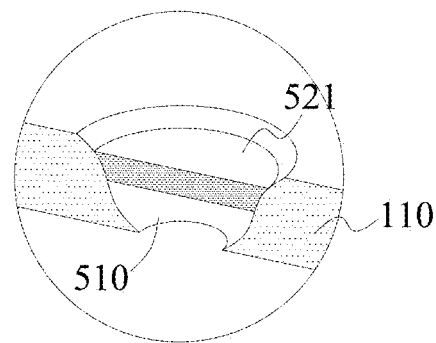
FIG. 16 is a schematic diagram illustrating a principle of blocking a gas guide passage by a melting member of FIG. 15 after the melting member is melted and solidified.

Or, in some embodiments of the present disclosure, the rate of the change of the diameter of the gas guide passage 510 with the height varies along the height direction. For example, as shown in FIG. 15 and FIG. 16, the rate of the change of the diameter of the gas guide passage 510 with the height may first decrease and then increase, so that a variable-diameter hole having a longitudinal section with an S-shaped profile is formed.

In order to enhance strength of connection between the melting member 520 and the inner wall of the gas guide passage 510 to ensure a sealing effect of the melting member 520 on the pressure reference chamber 100, in a preferred embodiment of the present disclosure, an inner surface of the gas guide passage 510 may be processed to enlarge a surface area. For example, internal threads or a structure approximate to the threads may be formed on the inner wall of the gas guide passage 510, or the inner wall of the gas guide passage 510 may be subjected to a frosting process or a surface corrosion process, so as to increase a surface area of the inner wall of the gas guide passage 510, thereby increasing a contact area of the inner wall of the gas guide passage 510 with the melting member 520, improving strength of connection between the melting member 520 and the top cover body 110, and ensuring the sealing effect of the melting member 520 on the pressure reference chamber 100.

Figure 17:
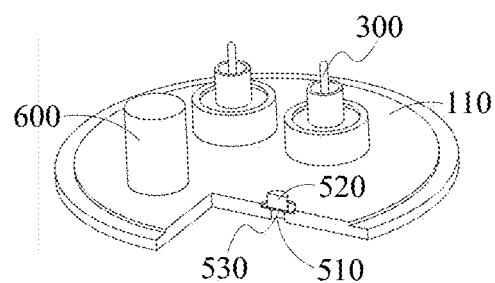
FIG. 17 is a schematic structural diagram of a gas absorption assembly in a pressure sensor according to an embodiment of the present disclosure.

In order to further ensure the sealing effect of the melted melting member 520 on blocking the gas guide passage 510, in a preferred embodiment of the present disclosure, as shown in FIG. 17, the top cover assembly 130 further includes a flow guide member 530 disposed in the gas guide passage 510. The blocking member 521 before melting (i.e., the melting member 520) is disposed on the flow guide member 530; and after the melting member 520 is melted and cooled to solidify to form the blocking member 521, the blocking member 521 together with the flow guide member 530 seal the gas guide passage 510. The flow guide member 530 is provided with at least one flow guide through hole for connecting the pressure reference chamber 100 to the outside.

In the embodiments of the present disclosure, the top cover body 110 of the pressure reference chamber 100 is further provided with the flow guide member 530, and while guiding the flow of the melted melting member 520, the flow guide member 530 together with the melted melting member 520 seal the gas guide passage 510. Therefore, combination performance and connection strength of the melting member 520 and the gas guide passage 510 can be improved through the flow guide member 530, thereby ensuring the sealing effect of the melted melting member 520 on blocking the gas guide passage 510.

In addition, the flow guide member 530 may support the blocking member 521 before melting (i.e., the melting member 520), so as to prevent the melting member 520 from completely blocking the gas guide passage 510, thereby enabling the gas to successfully flow out from the pressure reference chamber 100.

In a preferred embodiment of the present disclosure, the flow guide member 530 is provided with a plurality of flow guide through holes. For example, the flow guide member 530 may be formed into a porous part such as a mesh-like porous part, so as to prevent the melting member 520 from falling into the pressure reference chamber 100 while ensuring that the gas may smoothly flow out from the pressure reference chamber 100. Moreover, after the melting member 520 is melted, the porous flow guide member 530 can provide greater surface tension to prevent the liquid melting member 520 from flowing into the pressure reference chamber 100 below. In addition, the porous flow guide member 530 can form stable bonding relationship with the melting member 520 after the melting member 520 solidifies, thereby improving product reliability.

In order to improve manufacturing flexibility of the pressure sensor, in a preferred embodiment of the present disclosure, before the melting member 520 is melted, the flow guide member 530 is fixedly connected to the top cover body 110 in advance, or the flow guide member 530 is fixedly connected to the melting member 520 in advance.

For example, the flow guide member 530 may be first combined with the gas guide passage 510 (for example, the gas guide passage 510 and the flow guide member 530 are welded together by brazing), and after the melting member 520 is melted and cooled to solidify to form the blocking member 521, the blocking member 521 is combined with the flow guide member 530 and the gas guide passage 510.

Or, the flow guide member 530 may be first combined with the melting member 520 (for example, a small part of the blocking member 521 is first melted and solidified, and then welded together with the flow guide member 530), and then the melting member 520 is combined with the flow guide member 530 and the gas guide structure 510 after being melted.

It should be noted that, since the pressure sensor needs to be degassed (i.e., the vacuumizing process) at a high temperature, the preset melting temperature of the melting member 520 cannot be too low, and generally needs to be higher than 200° C. (Celsius); moreover, the melting temperature of the melting member 520 cannot be too high, otherwise the manufacturing cost of the pressure sensor is increased due to the over-high melting temperature (supporting equipment for the pressure sensor, such as a temperature measuring member, needs to be replaced to resist higher temperatures), and the other parts in the pressure sensor is prone to be damaged. In general, the melting temperature needs to be lower than 800° C.

For example, in an alternative embodiment of the present disclosure, a material of the blocking member 521 before melting (i.e., the melting member 520) may include at least one metal material with a low melting point, such as tin, aluminum, or silver. Or, the material of the blocking member 521 before melting (i.e., the melting member 520) may include a non-metallic material with a low melting point, such as glass.

In order to further ensure the sealing effect of the melted melting member 520 on blocking the gas guide passage 510, in a preferred embodiment of the present disclosure, a material film layer having good weldability and sealing property relative to the melting member may be disposed on a surface of the flow guide member 530 or the inner wall of the gas guide passage 510, so as to expand a selection range of the material of the melting member 520 while ensuring the effect of the melting member 520 on blocking the gas guide passage 510. Specifically, a bonding material layer is provided on the surface of the flow guide member 530 and/or the inner wall of the gas guide passage 510, and a material of the bonding material layer includes at least one of copper or nickel.

In an alternative embodiment of the present disclosure, the bonding material layer may be attached to the surface of the flow guide member 530 and/or the inner wall of the gas guide passage 510 by electroplating.

In order to save material cost and improve sealing performance of the pressure reference chamber 100, in a preferred embodiment of the present disclosure, the gas guide passage 510 corresponding to the melting member 520 may be a through hole structure at the top cover body 110 which corresponds to another component on the top cover body 110 or a through hole structure of another component mounted on the top cover body 110.

Figure 19:
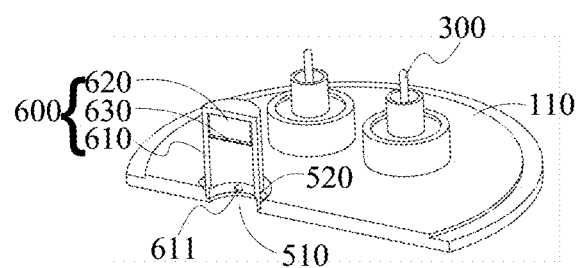
FIG. 19 is a schematic diagram of a partial structure of a pressure sensor according to another embodiment of the present disclosure.

For example, as shown in FIG. 19, the gas guide passage includes a communication passage and a gap between the bottom end of the pump housing 610 and the top cover body 110, and the pressure reference chamber 100 may be communicated with the outside sequentially through the communication passage and the gap. The blocking member 521 before melting (i.e., the melting member 520) is disposed outside the pump housing 610 and on the top cover body 110.

In the embodiments of the present disclosure, the gas absorption assembly 600 is communicated with the interior of the pressure reference chamber 100 through the gap between the bottom end of the pump housing 610 and the top cover body 110. During the vacuumizing process, the gas may be drawn out through the gap between the bottom end of the pump housing 610 and the top cover body 110. Then, the melting member 520 is melted and is solidified to form the blocking member 521, and the blocking member 521 blocks the gap between the bottom end of the pump housing 610 and a sidewall of the gas guide passage 510, thereby sealing the pressure reference chamber 100.

In order to improve smoothness of the gas flowing out from pressure reference chamber 100 during the vacuumizing step, in a preferred embodiment of the present disclosure, as shown in FIG. 19, the gas guide passage 510 further includes a communication hole 611 penetrating through a sidewall of the pump housing 610 and located close to the bottom end of the pump housing 610, and the sidewall of the pump housing 610 is provided with the communication hole 611 which penetrates through the sidewall of the pump housing 610 along a thickness direction. The pressure reference chamber 100 may be communicated with the outside sequentially through the communication passage and the communication hole 611, and may be communicated with the outside sequentially through the communication passage and the gap between the bottom end of the pump housing 610 and the top cover body 110. The blocking member 521 before melting (i.e., the melting member 520) is disposed on the top cover body 110 and corresponds to the communication hole, and a position of the communication hole is lower than the top surface of the top cover body.

Or, the bottom end of the pump housing 610 may be fixedly connected to the top cover body 110 in advance (for example, the bottom end of the pump housing 610 and the top cover body 110 are welded together), that is, there is no gap between the bottom end of the pump housing 610 and the top cover body 110. The gas guide passage 510 only includes a communication passage and a communication hole 611 penetrating through a sidewall of the pump housing 610 and located close to the bottom end of the pump housing 610. The pressure reference chamber 100 may be communicated with the outside sequentially through the communication passage and the communication hole 611. The blocking member 521 before melting (i.e., the melting member 520) is disposed on the top cover body 110 and corresponds to the communication hole, and a position of the communication hole is lower than the top surface of the top cover body.

In a second aspect of the present disclosure, there is provided a manufacturing method for a pressure sensor, including:

step S1, placing the blocking member 521 before melting (i.e., the melting member 520) at a position corresponding to the gas guide passage 510;

step S2, placing at least one pressure sensor provided in the present disclosure in a process chamber;

step S3, vacuumizing the process chamber to make a gas pressure in the process chamber lower than a preset pressure;

step S4, heating the process chamber to make a temperature in the process chamber not lower than a preset melting temperature; and step S5, cooling the process chamber to enable the blocking member 521, which is formed by the melted melting member 520 after the melted melting member 520 solidifies, to block the corresponding gas guide passage.

In the manufacturing method for the pressure sensor provided in the present disclosure, the top cover assembly 130 of the pressure sensor is provided with the gas guide passage 510 capable of connecting an interior of the pressure reference chamber 100 to the outside, the melting member 520 placed at the position corresponding to the gas guide passage 510 is heated to be at least partially melted, and the melting member 520 which is at least partially melted is cooled to solidify to seal the gas guide passage 510. In this way, only by vacuumizing the pressure reference chamber 100 before the blocking member 521 is formed and heating and cooling the pressure sensor, the melting member 520 can be melted and cooled to solidify to form the blocking member 521 to seal the gas guide passage 510, so that the interior of the pressure reference chamber 100 can be isolated from the external environment, thereby obtaining the pressure sensor capable of being used for pressure detection. During the manufacturing process of the pressure sensor provided in the present disclosure, there is no need to assemble structures such as the vacuum pump and the copper tube, so that manufacturing efficiency of the pressure sensor is increased. Moreover, compared with the exposed cut-off portion of the copper tube, the structure of sealing the gas guide passage 510 with the blocking member 521 formed by melting and cooling to solidify the melting member 520 in the present disclosure is more stable, so that stability of an overall structure of the pressure sensor is improved, thereby effectively avoiding gas leakage of the pressure reference chamber 100, and ensuring pressure detection precision of the pressure sensor.

Furthermore, with the manufacturing method for the pressure sensor provided in the present disclosure, a plurality of pressure sensors can be simultaneously subjected to a sealing process on the pressure reference chambers 100, and the plurality of pressure sensors can be manufactured in the same process, thereby greatly increasing the manufacturing efficiency of the pressure sensor.

Optionally, while vacuumizing the process chamber to make the gas pressure in the process chamber lower than the preset pressure, the manufacturing method further includes heating the process chamber to a first preset temperature, which is lower than the preset melting temperature. That is, the pressure sensor is preliminarily heated, but it needs to be ensured that the melting member 520 is not melted, so as to prevent the gas guide passage 510 from being blocked early. Optionally, the first preset temperature may be from 200° C. to 300° C.

Optionally, as shown in FIG. 6, the process chamber includes a chamber body 10, a heater 20, and a vacuum pump 30. The heater 20 is disposed in the chamber body 10, and is configured to heat a pressure sensor in the chamber body 10 (for example, the heater 20 may heat the pressure sensor by means of infrared light irradiation). The vacuum pump 30 is disposed on an exhaust pipe of the chamber body 10, and is configured to vacuumize the process chamber (i.e., to draw out a gas from the chamber body 10).

In a third aspect of the present disclosure, there is provided a semiconductor process apparatus, including a detection circuit and the pressure sensor provided in the present disclosure. The detection circuit is connected to the pin of the pressure sensor, and is configured to determine a gas pressure of an environment where the pressure sensor is located in response to a change of capacitance between the movable membrane 200 and the inner electrode 410 of the pressure sensor.

In the semiconductor process apparatus provided in the present disclosure, the top cover body 110 of the pressure reference chamber 100 of the pressure sensor is provided with the gas guide passage 510 which penetrates through the top cover body 110 along a thickness direction, and the melting member 520 is melted and solidified to form the blocking member 521 in the gas guide passage 510 to block the gas guide passage 510, thereby improve stability of an overall structure of the pressure sensor, effectively avoiding gas leakage of the pressure reference chamber 100, and ensuring pressure detection precision of the pressure sensor. Moreover, a plurality of pressure sensors can be manufactured simultaneously, thereby increasing manufacturing efficiency of the pressure sensor.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and those modifications and improvements are also considered to fall within the scope of the present disclosure.

What is claimed is:

1. A pressure sensor, comprising a top cover assembly, an upper seat, and a movable membrane, wherein each of a top and a bottom of the upper seat is provided with an opening, the top cover assembly seals the opening at the top of the upper seat, the movable membrane seals the opening at the bottom of the upper seat, the top cover assembly, the upper seat, and the movable membrane form a pressure reference chamber, the pressure sensor is configured to detect a gas pressure on a side of the movable membrane away from the top cover assembly based on a state of the movable membrane, wherein, at least one gas guide passage is formed at the top cover assembly, and is configured to connect the pressure reference chamber to the outside, the top cover assembly comprises at least one blocking member configured to seal the gas guide passage, wherein the blocking member before melting is disposed in the gas guide passage, and the blocking member seals the gas guide passage after being heated to a temperature higher than a preset melting temperature to be at least partially melted and being cooled to solidify.

2. The pressure sensor of claim 1, wherein the top cover assembly comprises a top cover body, which seals the opening at the top of the upper seat, the gas guide passage penetrating through the top cover body along a thickness direction of the top cover body is formed at the top cover body, and the blocking member before melting is disposed on the top cover body and corresponds to the gas guide passage.

3. The pressure sensor of claim 2, wherein a size of a cross section of the gas guide passage at any position is smaller than or equal to a size of a cross section of the gas guide passage at a side of the gas guide passage away from the movable membrane.

4. The pressure sensor of claim 3, wherein the gas guide passage comprises an accommodating hole formed on a top surface of the top cover body, and a through hole penetrating through the top cover body to a bottom surface of the top cover body from a bottom end of the accommodating hole, and a diameter of the accommodating hole is larger than a diameter of the through hole; and the blocking member before melting extends along a direction around an axis of the through hole and is disposed in the accommodating hole.

5. The pressure sensor of claim 4, wherein the gas guide passage further comprises a variable-diameter hole connected between the accommodating hole and the through hole, and a diameter of the variable-diameter hole gradually increases along a direction departing from the movable membrane.

6. The pressure sensor of claim 3, wherein a diameter of the gas guide passage gradually increases along a direction departing from the movable membrane, and the blocking member before melting is disposed in the gas guide passage.

7. The pressure sensor of claim 3, wherein the top cover assembly further comprises a flow guide member disposed in the gas guide passage; the blocking member before melting is disposed on the flow guide member, and after the blocking member is formed by melting, cooling, and solidifying, the blocking member together with the flow guide member seal the gas guide passage; and the flow guide member is provided with at least one flow guide through hole for connecting the pressure reference chamber to the outside.

8. The pressure sensor of claim 7, wherein a material of the blocking member comprises at least one of tin, aluminum, or silver; and a bonding material layer is provided on a surface of the flow guide member and/or an inner wall of the gas guide passage, and a material of the bonding material layer comprises at least one of copper or nickel.

9. The pressure sensor of claim 1, wherein the top cover assembly comprises a top cover body and a gas absorption assembly disposed on the top cover body, the gas absorption assembly comprises a pump housing and a getter disposed in the pump housing, the top cover body is provided with a communication passage which connects the pump housing to the pressure reference chamber, and a bottom end of the pump housing is disposed in the communication passage, wherein the gas guide passage comprises the communication passage and a communication hole penetrating through a sidewall of the bottom end of the pump housing, the pressure reference chamber is communicated with the outside sequentially through the communication passage and the communication hole, the blocking member before melting is disposed on the top cover body and corresponds to the communication hole, and a position of the communication hole is lower than a top surface of the top cover body; and/or the gas guide passage comprises the communication passage and a gap between the bottom end of the pump housing and the top cover body, the pressure reference chamber is communicated with the outside sequentially through the communication passage and the gap, and the blocking member before melting is disposed outside the pump housing and on the top cover body.

10. A manufacturing method for a pressure sensor for manufacturing the pressure sensor of claim 1, comprising:

placing the blocking member before melting at a position corresponding to the gas guide passage;

placing at least one pressure sensor that is not blocked in a process chamber;

vacuumizing the process chamber to make a gas pressure in the process chamber lower than a preset pressure;

heating the process chamber to make a temperature in the process chamber not lower than the preset melting temperature; and cooling the process chamber to enable the blocking member, which is formed by melting and solidifying the blocking member before melting, to block the gas guide passage.

11. The manufacturing method of claim 10, wherein, while vacuumizing the process chamber to make the gas pressure in the process chamber lower than the preset pressure, the manufacturing method further comprises heating the process chamber to a first preset temperature, which is lower than the preset melting temperature.

12. The manufacturing method of claim 10, wherein the top cover assembly comprises a top cover body, which seals the opening at the top of the upper seat, the gas guide passage penetrating through the top cover body along a thickness direction of the top cover body is formed at the top cover body, and the blocking member before melting is disposed on the top cover body and corresponds to the gas guide passage.

13. The manufacturing method of claim 12, wherein a size of a cross section of the gas guide passage at any position is smaller than or equal to a size of a cross section of the gas guide passage at a side of the gas guide passage away from the movable membrane.

14. The manufacturing method of claim 13, wherein the gas guide passage comprises an accommodating hole formed on a top surface of the top cover body, and a through hole penetrating through the top cover body to a bottom surface of the top cover body from a bottom end of the accommodating hole, and a diameter of the accommodating hole is larger than a diameter of the through hole; and the blocking member before melting extends along a direction around an axis of the through hole and is disposed in the accommodating hole.

15. The manufacturing method of claim 14, wherein the gas guide passage further comprises a variable-diameter hole connected between the accommodating hole and the through hole, and a diameter of the variable-diameter hole gradually increases along a direction departing from the movable membrane.

16. The manufacturing method of claim 13, wherein a diameter of the gas guide passage gradually increases along a direction departing from the movable membrane, and the blocking member before melting is disposed in the gas guide passage.

17. The manufacturing method of claim 13, wherein the top cover assembly further comprises a flow guide member disposed in the gas guide passage; the blocking member before melting is disposed on the flow guide member, and after the blocking member is formed by melting, cooling, and solidifying, the blocking member together with the flow guide member seal the gas guide passage; and the flow guide member is provided with at least one flow guide through hole for connecting the pressure reference chamber to the outside.

18. The manufacturing method of claim 10, wherein the top cover assembly comprises a top cover body and a gas absorption assembly disposed on the top cover body, the gas absorption assembly comprises a pump housing and a getter disposed in the pump housing, the top cover body is provided with a communication passage which connects the pump housing to the pressure reference chamber, and a bottom end of the pump housing is disposed in the communication passage, wherein the gas guide passage comprises the communication passage and a communication hole penetrating through a sidewall of the bottom end of the pump housing, the pressure reference chamber is communicated with the outside sequentially through the communication passage and the communication hole, the blocking member before melting is disposed on the top cover body and corresponds to the communication hole, and a position of the communication hole is lower than a top surface of the top cover body; and/or the gas guide passage comprises the communication passage and a gap between the bottom end of the pump housing and the top cover body, the pressure reference chamber is communicated with the outside sequentially through the communication passage and the gap, and the blocking member before melting is disposed outside the pump housing and on the top cover body.

19. The manufacturing method of claim 17, wherein a material of the blocking member comprises at least one of tin, aluminum, or silver; and a bonding material layer is provided on a surface of the flow guide member and/or an inner wall of the gas guide passage, and a material of the bonding material layer comprises at least one of copper or nickel.

* * * * *